United States Patent [19]

Takemae

[11] Patent Number: 4,692,689
[45] Date of Patent: Sep. 8, 1987

[54] FET VOLTAGE REFERENCE CIRCUIT WITH THRESHOLD VOLTAGE COMPENSATION

[75] Inventor: Yoshihiro Takemae, Tokyo, Japan

[73] Assignee: Fujitsu Limited, Kawasaki, Japan

[21] Appl. No.: 15,529

[22] Filed: Feb. 12, 1987

Related U.S. Application Data

[63] Continuation of Ser. No. 663,712, Oct. 22, 1984, abandoned.

[30] Foreign Application Priority Data

Nov. 11, 1983 [JP] Japan .................. 58-212083

[51] Int. Cl.[4] .............................................. G05F 3/24
[52] U.S. Cl. .................... 323/313; 307/297;
   307/304; 323/314; 323/349; 323/350; 365/226
[58] Field of Search ............. 323/311, 313, 349, 350,
   323/314; 307/296 R, 297, 304; 365/226

[56] References Cited

U.S. PATENT DOCUMENTS

| 3,823,332 | 7/1974 | Feryszka et al. | 307/297 |
| 4,197,511 | 4/1980 | Bell | 330/293 |
| 4,453,121 | 6/1984 | Noufer | 323/313 |
| 4,641,081 | 2/1987 | Sato et al. | 323/313 |
| 4,649,291 | 3/1987 | Konishi | 307/297 |

FOREIGN PATENT DOCUMENTS

| 29231 | 5/1981 | European Pat. Off. | 323/313 |
| 3138558 | 4/1983 | Fed. Rep. of Germany | 323/313 |
| 571800 | 9/1977 | U.S.S.R. | 323/313 |

OTHER PUBLICATIONS

IBM Technical Disclosure Bulletin, vol. 26, No. 4, Sep. 1983, p. 2073, New York, U.S.; R. D. Burke: "FET Voltage Regulator Circuit".

Askin et al., "FET Device Parameters Compensation Circuit", IBM Tech. Discl. Bul., vol. 14, No. 7, pp. 2088, 2089, Dec. 1971.

Primary Examiner—William H. Beha, Jr.
Attorney, Agent, or Firm—Staas & Halsey

[57] ABSTRACT

A voltage converting circuit has an output MIS transistor which gives a low output impedance and outputs an intermediate level of power source voltage. The output level is set with a high accuracy through a voltage dividing ratio determined by an impedance element. This impedance element is connected with a compensating MIS transistor to compensate for variations of the gate threshold voltage caused by the manufacturing process.

10 Claims, 9 Drawing Figures

FET VOLTAGE REFERENCE CIRCUIT WITH THRESHOLD VOLTAGE COMPENSATION

This is a continuation of co-pending application Ser. No. 663,712 filed on Oct. 22, 1984, now abandoned 2/12/87.

BACKGROUND OF THE INVENTION

This invention relates to a voltage converting circuit which outputs an intermediate level of power supply voltage and particularly to a voltage converting circuit which is suitable for use in a MIS type integrated circuit.

It is often required in a MIS type integrated circuit to use a constant voltage having an intermediate level with respect to the power supply voltage supplied from an external circuit. For instance, an intermediate level of, for example, 2.5 V is steadily applied to a common capacitor electrode incorporated into memory cells in a MIS type dynamic random access memory operative under a power supply voltage of 5 V.

The intermediate level is obtained easily using a resistance dividing circuit as shown on FIG. 1. In this figure, resistors $R_1$, $R_2$ divide the power supply voltage $V_{cc}$ in order to obtain an intermediate voltage $V_{cc}'$ to be provided to a load circuit L. For a sufficiently low load current, when $R_1=R_2$, then $V_{cc}'=V_{cc}/2$. However, when a load circuit L consumes a current that is sufficiently high, such a relation is not maintained. Moreover, in this example, the resistors $R_1$, $R_2$ are connected in series between the power source $V_{cc}$ of +5 V and the power source $V_{ss}$ of 0 V, a current always flows from $V_{cc}$ to $V_{ss}$, and thereby a large amount of power is consumed. This is one disadvantage of this circuit. Such power consumption can be reduced by making large the resistors $R_1$, $R_2$. However, if a resistance value is large, the above change in the voltage $V_{cc}'$ at node N1 due to a load current becomes large.

The circuit shown in FIG. 2 is effective for reducing power consumption and fluctuation of the load voltage $V_{cc}'$ due to a change of the load current. In this circuit, a divided voltage of power source $V_{cc}$ obtained through the resistors $R_1$, $R_2$ is given to the gate of a MIS transistor $Q_1$ and an output of said transistor $Q_1$ is applied to the load circuit L. $Q_1$ constitutes an output transistor of low output impedance. Therefore, a load current flows through the drain and source of transistor $Q_1$ but does not flow into the voltage dividing circuit $R_1$, $R_2$. There is no change of load voltage $V_{cc}'$ and, since the dividing circuit only gives a voltage to the gate of the MIS transistor $Q_1$, the circuit is allowed to have a high resistance value, thus resulting in less power consumption. Because of the relation $V_N - V_{th} = V_{cc}'$ between the voltage $V_N$ of node $N_1$ and load voltage $V_{cc}'$, when $V_{cc}'=V_{cc}/2$ is required, $V_N$ is selected to have a value satisfying the relation, $V_N = V_{th} + V_{cc}/2$. $V_{th}$ indicates the gate threshold voltage of the MIS transistor $Q_1$.

However, this circuit has a problem in that a threshold voltage $V_{th}$ of the transistor $Q_1$ directly affects a load voltage $V_{cc}'$ and $V_{th}$ changes in accordance with the integration circuit manufacturing process, whereby the load voltage $V_{cc}'$ fluctuates for each product.

Namely, it is well known that a resistance ratio of two resistors in an integrated circuit has only a small error, although there are changes of $V_{th}$ depending on the manufacturing process. For example, it is easy to ensure that an error of resistance value ratio is as small as 1% or less. Therefore, a voltage $V_N$ of node $N_1$ can be set accurately. Meanwhile, the gate threshold voltage of a MIS transistor is easily affected by a process fluctuation, and an error as small as 0.2 V can easily be generated. This error means, for example, that an error of about 10% easily occurs in the circuit for generating an output voltage $V_{cc}'$ of 2.5 V.

SUMMARY OF THE INVENTION

An object of this invention is to provide a voltage converting circuit which outputs an intermediate level of power source voltage.

Another object of this invention is to provide a voltage converting circuit which consumes less power.

Yet another object of this invention is to provide a voltage converting circuit comprising an output MIS transistor which gives a small output impedance.

A further object of this invention is to prevent an output voltage from being affected by a variation of the threshold voltage $V_{th}$ caused by a fluctuation in the manufacturing process for output MIS transistors of voltage converting circuits.

In accordance with the present invention, a voltage converting circuit is provided for receiving a power source voltage and providing a constant voltage having the level of a predetermined porportional division of said power source voltage, comprising:
  an output MIS transistor for outputting said constant voltage, with the MIS transistor having a gate which receives a gate control voltage; and
  a gate control means for providing said gate of said MIS transistor with said gate control voltage, comprising an impedance means connected to receive said power source voltage for providing said predetermined proportional division, and compensating means having at least one compensation MIS transistor connected to said impedance means, for compensating the gate control voltage for the gate threshold voltage of said output MIS transistor to provide said constant voltage corresponding to said predetermined proportional division irrespective of variation of said gate threshold voltage.

BRIEF DESCRIPTION OF THE DRAWINGS

The above and other objects and advantages of the present invention will be more apparent from the following description of the preferred embodiments with reference to the accompanying drawings, wherein.

DESCRIPTION OF THE PREFERRED EMBODIMENTS

Figure 1:
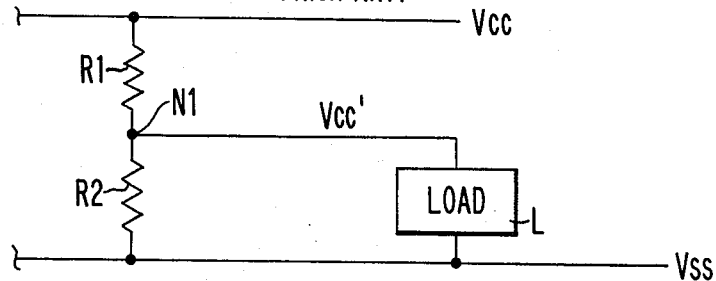
FIG. 1 is a circuit diagram of a voltage converting circuit in the prior art.
Figure 2:
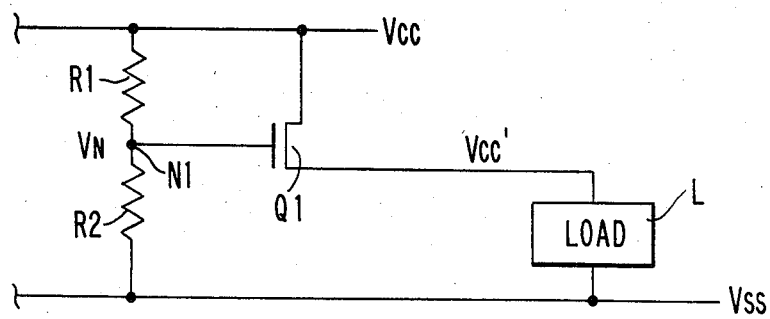
FIG. 2 is a schematic diagram of the other voltage converting circuit in the prior art.
Figure 3:
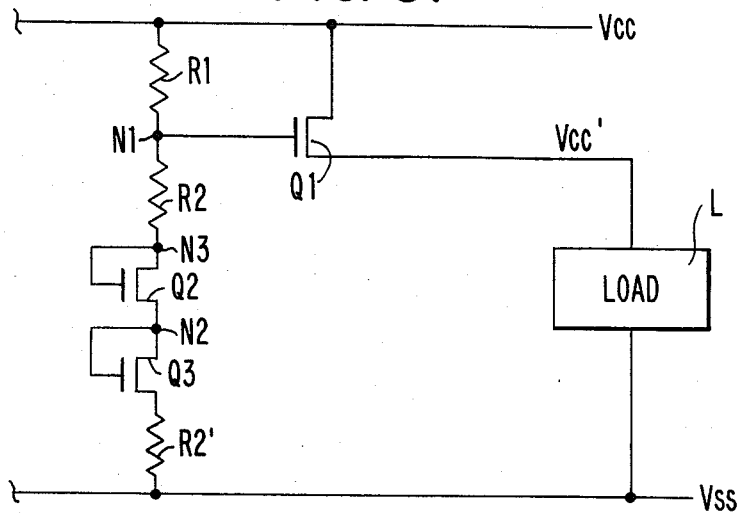
FIG. 3 is a schematic diagram of a voltage converting circuit in an embodiment of this invention.

FIG. 3 shows an embodiment of this invention. From FIG. 1 to FIG. 8, the same portions as those in FIG. 1 and FIG. 2 are given the same symbols for convenience of description. In comparison with the circuit of the prior art as shown in FIG. 2, the circuit of FIG. 3 is different therefrom in such a point that the MIS transistors $Q_2$, $Q_3$ are inserted into the voltage dividing circuit (gate voltage control circuit). In the circuit of FIG. 3, a pair of N channel MIS transistors $Q_2$, $Q_3$ are connected in series to the resistor elements $R_1$ and $R_2$ which give a voltage dividing ratio. A divided output from the series circuit of resistor elements $R_1$, $R_2$ and MIS transistors $Q_2$, $Q_3$ is given at the node $N_1$ to the gate of the output N channel MIS transistor $Q_1$. The transistors $Q_2$, $Q_3$ are provided for compensating its gate threshold voltage, and the number of transistors depends on the voltage dividing ratio. The circuit of FIG. 3 is provided for outputting a voltage of $V_{cc}/2$ and two transistors $Q_2$ and $Q_3$ are required in this case. Said circuit of FIG. 3 operates normally when a voltage of the power source voltage supply line is higher than the normal voltage $V_{cc}/2$ to be output. In this case, the voltage of node $N_2$ is $V_{th}$, the voltage of node $N_3$ is $2 \times V_{th}$. When $R_1 = R_2$, the voltage of node $N_1$ is indicated by $(V_{cc} - 2V_{th})/2 + 2V_{th} = V_{cc}/2 + V_{th}$. Since the transistors $Q_1$, $Q_3$ are formed by the same process on a semiconductor substrate, these transistors can be considered to have the same threshold voltage. When the node $N_1$ has the above voltage, a load voltage $V_{cc}'$ is $V_{cc}/2$, which is lower than the above voltage by $V_{th}$. Thereby, a voltage $V_{cc}'$ irrespective of the threshold voltage of a transistor can be supplied to the load L.

Figure 4:
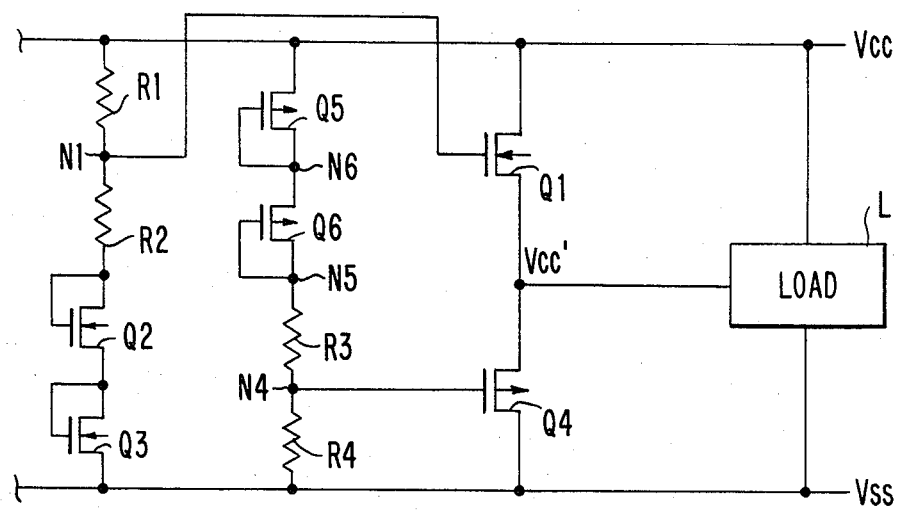
FIG. 4 is a schematic diagram of a voltage converting circuit in another embodiment of this invention.

FIG. 4 is a second embodiment of this invention. The circuit of FIG. 3 is based on the assumption that the load L always receives an input current through the transistor $Q_1$ (a current flows through $V_{cc}$–$Q_1$–L–$V_{ss}$) and that a current does not flow out from the load L toward the source of the transistor $Q_1$. However the circuit of FIG. 4 can operate properly even if current flows out from the load L. In this circuit, the circuit portion formed by $R_1$, $R_2$, $Q_3$, $Q_2$ is the same as that in FIG. 3, a load voltage $V_{cc}'$ is held thereby to $V_{cc}/2$, irrespective of $V_{th}$. The MIS transistors $Q_4$, $Q_5$, $Q_6$ resistors $R_3$, $R_4$ form a circuit which holds the load voltage $V_{cc}'$ to $V_{cc}/2$ in such a case where a current flows into the power supply $V_{ss}$ through the transistor $Q_4$ from the load L. Here, $Q_4$, $Q_5$, $Q_6$ are P channel transistors. Namely, the voltage of node $N_6$ is $V_{cc} - V_{thp}$, the voltage of node $N_5$ is $V_{cc} - 2V_{thp}$ and the voltage of node $N_4$ is $(V_{cc} - 2V_{thp})/2 = V_{cc}/2 - V_{thp}$ when $R_3 = R_4$. $V_{thp}$ is the gate threshold voltage of the p channel transistor $Q_4$. Since a voltage of node $N_4$ is lower than $V_{cc}'$ by $V_{th}$ of $Q_4$, $V_{cc}'$ becomes $V_{cc}/2$. In the circuit of FIG. 4, a load voltage can be set constant irrespective of a load voltage $V_{th}$, in either case where a current flows into the load or a current flows out from the load.

It is desirable in actual design of the circuit of FIG. 4 to assure the avoidance of a steady current in the series circuit of transistors $Q_1$ and $Q_4$ by providing a small difference between the voltage dividing ratio of the resistors $R_1$, $R_2$ and the voltage dividing ratio of the resistors $R_3$, $R_4$. For example, the voltage of node $N_1$ should advantageously be $V_{cc}/2 + V_{th}$ minus several 10 mV and the voltage of node $N_4$ should be $V_{cc}/2 - V_{thp}$ plus several 10 mV. Thereby, when the output voltage $V_{cc}'$ is $V_{cc}/2$, both output transistors $Q_1$, $Q_4$ are set to the cut-off condition. IF the output voltage $V_{cc}'$ rises or drops, the output transistors $Q_1$ or $Q_4$ become selectively ON and suppress the change of voltage described above.

Figure 5:
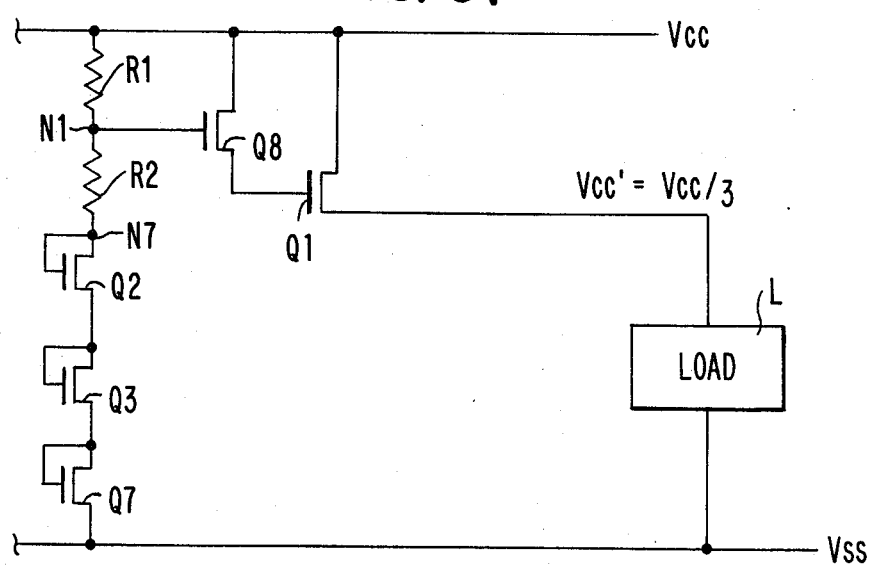
FIG. 5 is a schematic diagram of a voltage converting circuit in yet another embodiment of this invention.
Figure 6:
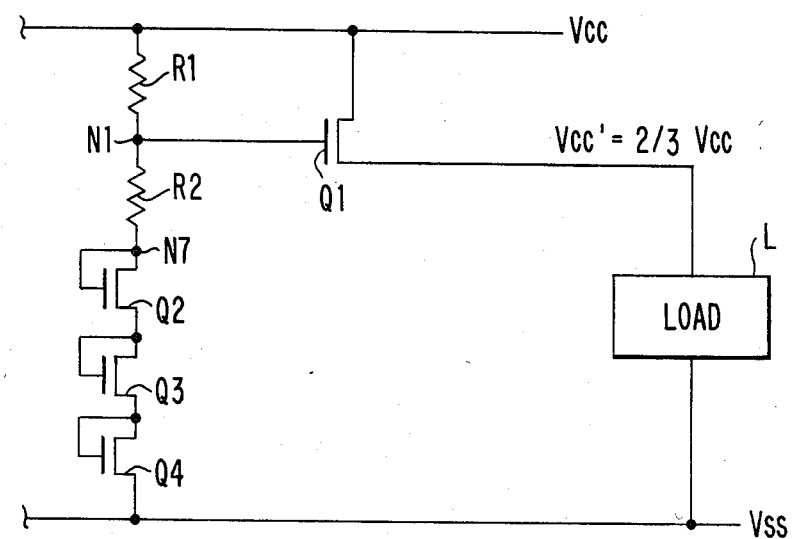
FIG. 6 is a schematic diagram of a voltage converting circuit in a further embodiment of this invention.

FIG. 5 and FIG. 6 show the third and fourth embodiments of this invention. The former holds a load voltage $V_{cc}'$ to $V_{cc}/3$, while the latter to $2V_{cc}/3$. Namely, since the voltage of node $N_7$ is $3V_{th}$ and the resistance values of resistors $R_1$, $R_2$ are selected in such a relation as $R_1 = 2R_2$ in FIG. 5, the voltage of node $N_1$ becomes equal to $(V_{cc} - 3V_{th})/3 + 3V_{th} = V_{cc}/3 + 2V_{th}$, and the load voltage $V_{cc}'$ is lower than this voltage level by $2V_{th}$ due to the voltage drop across transistors $Q_8$ and $Q_1$ thus becoming equal to $V_{cc}/3$. In FIG. 6, the voltage of node $N_7$ is $3V_{th}$, the voltage of node $N_1$ is $2(V_{cc} - 3V_{th})/3 + 3V_{th} = 2V_{cc}/3 + V_{th}$ when $2R_1 = R_2$, and the load voltage $V_{cc}'$ is lower than this voltage by $V_{th}$, becoming equal to $2V_{cc}/3$.

In general, the load voltage of $V_{cc}' = mV_{cc}/n$ can be obtained by using n transistors as the transistors $Q_2$, $Q_3$, . . . to be inserted in series with the resistance voltage dividing circuit, of the gate voltage control circuit and $(n-m-1)$ transistors as the transistors $Q_8$ . . . to be inserted into the gate circuit of the output transistor $Q_1$, and by setting a resistance ratio $R_2/(R_1 + R_2)$ to $m/n$. Thereby, a variety of load voltages $V_{cc}'$ which are not affected by $V_{th}$ can be obtained. In the above, m and n are integers for which $m < n$.

Figure 7A:
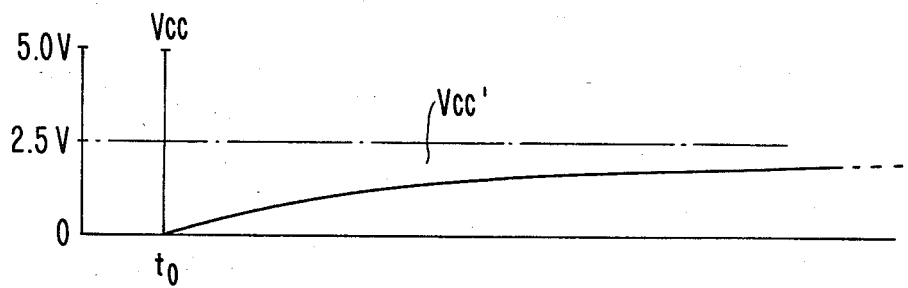
FIGS. 7(a) and (b) are respective the graphs which show the change in time of the converted voltage output after the power source is turned ON in the circuits of the prior art and of the embodiments of this invention.
Figure 7B:
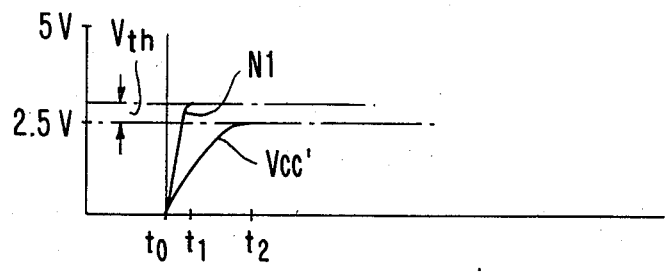

When the resistance value is made large in order to reduce power consumption in the resistance voltage dividing circuit, the time constant becomes large and the rising edge of the load voltage becomes gentle as shown in FIG. 7(a). In case a transistor $Q_1$ is used as in the case of FIG. 3, the load voltage $V_{cc}'$ quickly rises as shown in FIG. 7(b) and, when the power supply becomes ON, operation can be started immediately.

In the circuit of FIG. 3, the resistor $R_2$ may be shifted, for example, to the location between $Q_3$ and $V_{ss}$ from the location indicated. The alternate location for the resistor $R_2$ is indicated by the resistor $R_2'$, shown with the dotted line in the lower left corner of FIG. 3. In this case, the same result can also be obtained. Moreover, this method is superior in such a point that each transistor $Q_1$, $Q_2$, or $Q_3$ receives a similar back gate bias effect on its own $V_{th}$, since the source voltage of $Q_2$, $Q_3$ rises up to a value close to that of $Q_1$ and, thereby, $V_{th}$ of $Q_2$ and $Q_3$ becomes equal to that of $Q_1$.

Figure 8:
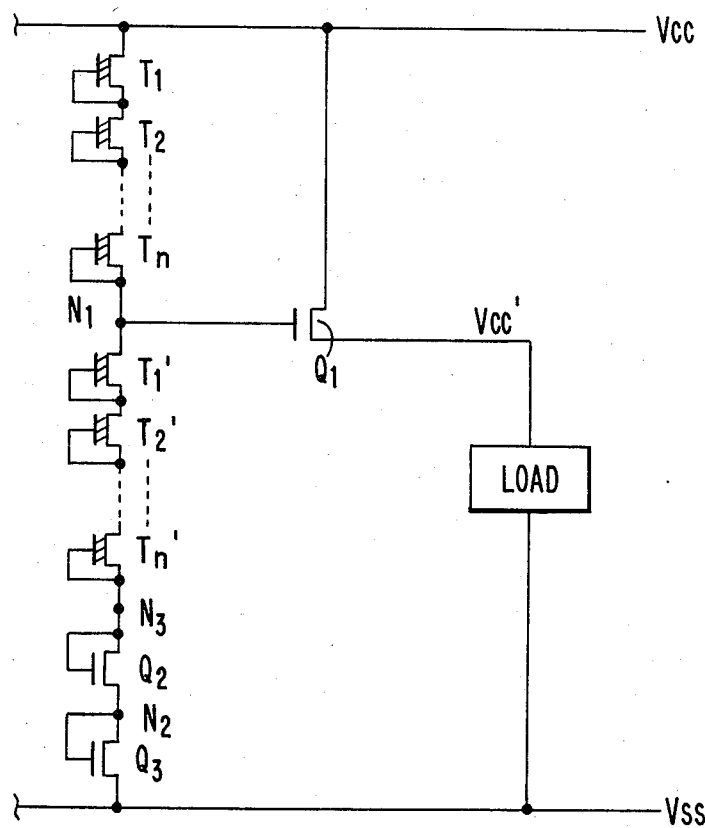
FIG. 8 is a schematic diagram of a voltage converting circuit in still a further embodiment of this invention.

FIG. 8 shows an embodiment where the resistors $R_1$, $R_2$ in FIG. 3 are replaced by depletion transistors $T_1$, $T_n$, $T_1'$ $T_n'$. The same transistors and the same nodes are indicated by the same symbols. In general, a resistance of the polysilicon layer or diffusion layer used in a MIS dynamic memory is as small as several 10 ohms/square. If it is desired to obtain a resistance of several 100 k-ohm as required for the resistors $R_1$, $R_2$ by using these resistance layers, an area of several hundreds of thousand $\mu^2$ becomes necessary. In order to avoid this, it is recommended to use one or a plurality of depletion transistors connected in series in place of resistors. Thereby, a current can be reduced using a small area.

I claim:

1. A voltage converting circuit for receiving a power source voltage and providing a constant voltage having a level of a predetermined proportional division of said power source voltage, comprising:

an output MIS transistor, having a gate and a threshold voltage, for outputting said constant voltage, wherein the gate of said output MIS transistor receives a gate control voltage; and gate control means for providing said gate of said output MIS transistor with said gate control voltage, comprising an output node for outputting said gate control voltage, resistive means, including pairs of resistive elements connected in series via said output node and connected to receive said power source voltage, for determining said predetermined proportional division, each resistive element having a resistance being independent of said threshold voltage, and compensating means, including a plurality of compensation MIS transistors connected in series with said resistive means, for compensating for the value of the threshold voltage of said output MIS transistor in the value of said gate control such that said constant voltage corresponding to said predetermined proportional division is output by said output MIS transistor irrespective of a common variation of the threshold voltage of each of said output and said compensation MIS transistors, the number of said compensation MIS transistors being in accordance with the proportion of said predetermined proportional division.

2. A voltage converting circuit as set forth in claim 1, wherein said resistive elements comprise a plurality of resistor elements connected in series with said compensation MIS transistors.

3. A voltage converting circuit as set forth in claim 1, wherein said resistive elements comprise a plurality of depletion MIS transistors connected in series with said compensation MIS transistors.

4. A voltage converting circuit as set forth in claim 1, wherein said output MIS transistor and each said compensation MIS transistor is produced in the same production process to have the same threshold voltage.

5. A voltage converting circuit as set forth in claim 1, wherein said impedance means comprises plural parts connected on opposite sides of said compensation MIS transistors.

6. A voltage converting circuit connected between first and second power source lines for supplying a power source voltage, for providing a constant voltage having an intermediate level with respect to said power source voltage, said circuit comprising:

first and second output MIS transistors respectively connected to said first and second power source lines and to each other to provide said constant voltage, the first and second output MIS transistor having respective first and second gates which receive first and second gate control voltages, respectively; and first and second gate control means, for providing said first and second gates with said first and second gate control voltages respectively, comprising:

first and second impedance means each connected between said first and second power source lines for providing first and second proportional divisions of said power source voltage, respectively; and first and second compensating means having first and second compensation MIS transistors connected to said first and second impedance means, respectively, for compensating the first and second gate control voltages for the respective gate threshold voltages of said first and second MIS transistors;

wherein said first and second output voltages are provided irrespective of variations of said gate threshold voltages, respectively.

7. A voltage converting circuit as set forth in claim 6, wherein each of said first output MIS transistor and said first compensation transistor comprises an N channel MIS transistor and each of said second output MIS transistors and said second compensation transistors comprises a P channel MIS transistor.

8. A voltage converting circuit as set forth in claim 6, wherein each said first and second impedance means has plural parts connected in series and on both sides of the respective first and second compensation MIS transistors.

9. A voltage coverting circuit as in claim 6, wherein at least one of said first and second output MIS transistors is in the cut-off state at any time.

10. A voltage converting circuit for receiving a power source voltage and providing a constant voltage having a level of a predetermined proporational division of said power source voltage defined by the ratio of m/n, wherein n and m are positive integers and m is less than n, comprising:

an output MIS transistor, having a gate and a threshold voltage, for outputting said constant voltage, wherein the gate of said output MIS transistor receives a gate control voltage; and gate control means for providing the gate of said output MIS transistor with said gate control voltage, comprising an output node for outputting said gate control voltage, resistive means, including pairs of resistive elements connected in series via said output node and connected to receive said power source voltage, for determining said predetermined proportional division, each resistive element having a resistance being independent of said threshold voltage, compensating means, connected in series with said resistive means, including first compensation MIS transistors, the number of said first compensation MIS transistors corresponding to the denominator n of said ratio of said predetermined proportional division, at least a second compensation MIS transistor connected in parallel with a portion of said resistive means, for providing said gate control voltage to said gate of said output MIS transistor, the number of said second compensation MIS transistors corresponding to the numerator m of said ratio;

said gate control voltage having the level of said constant voltage plus a threshold voltage of said output MIS transistor.

* * * * *

UNITED STATES PATENT AND TRADEMARK OFFICE
CERTIFICATE OF CORRECTION

PATENT NO.:     4,692,689
DATED      :    September 8, 1997
INVENTOR(S):    TAKEMAE It is certified that error appears in the above-identified patent and that said Letters Patent is hereby corrected as shown below:

Claim 1,    col. 5, line 10, change "pairs" to --a pair--.

Claim 10,   col. 6, line 42, change "pairs" to --a pair--.

Signed and Sealed this

Eighteenth Day of April, 2000

Attest:

Q. TODD DICKINSON

*Attesting Officer*    *Director of Patents and Trademarks*